United States Patent
Yoshioka et al.

(10) Patent No.: US 9,680,431 B2
(45) Date of Patent: Jun. 13, 2017

(54) AMPLIFIER CIRCUIT, PIPELINE ADC, AND WIRELESS COMMUNICATION DEVICE

(71) Applicant: KABUSHIKI KAISHA TOSHIBA, Minato-ku (JP)

(72) Inventors: Kentaro Yoshioka, Setagaya (JP); Tetsuro Itakura, Nerima (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/268,076

(22) Filed: Sep. 16, 2016

(65) Prior Publication Data

US 2017/0126188 A1     May 4, 2017

(30) Foreign Application Priority Data

Oct. 28, 2015  (JP) ................................. 2015-211840

(51) Int. Cl.
*H03M 1/38* (2006.01)
*H03F 3/45* (2006.01)
(Continued)

(52) U.S. Cl.
CPC ....... *H03F 3/45179* (2013.01); *H03K 3/0315* (2013.01); *H03M 1/1245* (2013.01);
(Continued)

(58) Field of Classification Search
CPC ............. H03F 3/45179; H03F 2200/78; H03F 2200/294; H03K 3/0315; H03M 1/1245; H03M 1/38; H04B 1/40
(Continued)

(56) References Cited

U.S. PATENT DOCUMENTS 6,828,927 B1   12/2004  Hurrell et al.
7,924,203 B2   4/2011   Hurrell
(Continued)

FOREIGN PATENT DOCUMENTS

JP   2016-225840   12/2016

OTHER PUBLICATIONS

A. Shikata, "A 4—10 bit, 0.4—1 V Power Supply, Power Scalable Asynchronous SAR-ADC in 40 nm-CMOS with Wide Supply Voltage Range SAR Controller," IEICE Trans. Fundamentals, vol. 96, No. 2, Feb. 2013, pp. 443-452.

(Continued)

*Primary Examiner* — Jean B Jeanglaude
(74) *Attorney, Agent, or Firm* — Oblon, McClelland, Maier & Neustadt, L.L.P.

(57) ABSTRACT

An amplifier circuit has a sample-and-hold circuit to sample and hold an input signal, an amplifier which comprises an input terminal inputted with the input signal held by the sample-and-hold circuit and an output terminal outputting an amplification signal obtained by amplifying the input signal inputted, a feedback capacitor to be connected between the input terminal and output terminal of the amplifier, a successive approximation circuit to perform successive approximation operation to correct the amplification signal based on a voltage of the input terminal of the amplifier, the successive approximation operation being performed a predetermined number of cycles, and a control circuit to control the successive approximation circuit based on an amplification error included in the amplification signal.

15 Claims, 12 Drawing Sheets

(51) Int. Cl.
*H03K 3/03* (2006.01)
*H03M 1/12* (2006.01)
*H04B 1/40* (2015.01)

(52) U.S. Cl.
CPC ......... *H03M 1/38* (2013.01); *H03F 2200/294* (2013.01); *H03F 2200/78* (2013.01); *H04B 1/40* (2013.01)

(58) Field of Classification Search
USPC ................................ 341/161, 156, 155, 122
See application file for complete search history.

(56) References Cited

U.S. PATENT DOCUMENTS

| | | | |
|---|---|---|---|
| 2004/0160351 A1* | 8/2004 | Rossi | H03F 3/005 341/161 |
| 2014/0085122 A1* | 3/2014 | Jeon | H03M 1/0678 341/158 |
| 2014/0210654 A1* | 7/2014 | Segawa | H03M 1/1245 341/122 |
| 2016/0204789 A1* | 7/2016 | Vyas | H03M 1/1225 341/161 |

OTHER PUBLICATIONS

Soon-Kyun Shin, et al., "A Fully-Differential Zero-Crossing-Bades 1.2V 10b 28MB/s Pipelined ADC in 65nm CMOS," IEEE Symposium on VLSI Circuits Digest of Technical Papers, 2008, pp. 216-219.

A. M. A. All. et al., "A 16-bit 250 MS/s IF Sampling Pipelined ADC With Background Calibration," IEEE JSSC, vol. 45, No. 12, Dec. 2012, pp. 2602-2612.

Soon-Kyun Shin, et al., "A 12 bit 200 MS/s Zero-Crossing-Based Pipelined ADC With Early Sub-ADC Decision and Output Residue Background Calibration," IEEE JSSC, vol. 49, No. 6, Jun. 2014, pp. 1366-1382.

* cited by examiner

| Count₂ | ENVIRONMENTAL CONDITION | NUMBER OF CYCLES n |
|---|---|---|
| 4 OR LESS | LOW SPEED | 3 |
| 5 OR GREATER AND 19 OR LESS | NORMAL SPEED | 5 |
| 20 OR GREATER | HIGH SPEED | 7 |

MAPPING TABLE

000# AMPLIFIER CIRCUIT, PIPELINE ADC, AND WIRELESS COMMUNICATION DEVICE

CROSS REFERENCE TO RELATED APPLICATIONS

This application is based upon and claims the benefit of priority from the prior Japanese Patent Application No. 2015-211840, filed on Oct. 28, 2015, the entire contents of which are incorporated herein by reference.

FIELD

Embodiments relate to an amplifier circuit, a pipeline ADC, and a wireless communication device.

BACKGROUND

Conventionally, an amplifier circuit having an operational amplifier is known as an amplifier circuit to amplify an analog signal by a predetermined amplification factor. In the amplifier circuit having an operational amplifier, virtual ground voltage of the operational amplifier approaches an ideal value as the gain of the operational amplifier becomes larger, which leads to the improvement of amplification accuracy. However, in recent years, the development of miniaturization of CMOS devices has made it difficult to design an operational amplifier having a high gain. This leads to a problem that an amplification error occurs depending on an error occurring in the virtual ground voltage of the operational amplifier.

Further, an amplifier circuit having a comparator instead of the operational amplifier has been proposed. However, the amplifier circuit having a comparator has a problem that an amplification error occurs depending on the finite delay of the comparator.

DETAILED DESCRIPTION

Figure 1:
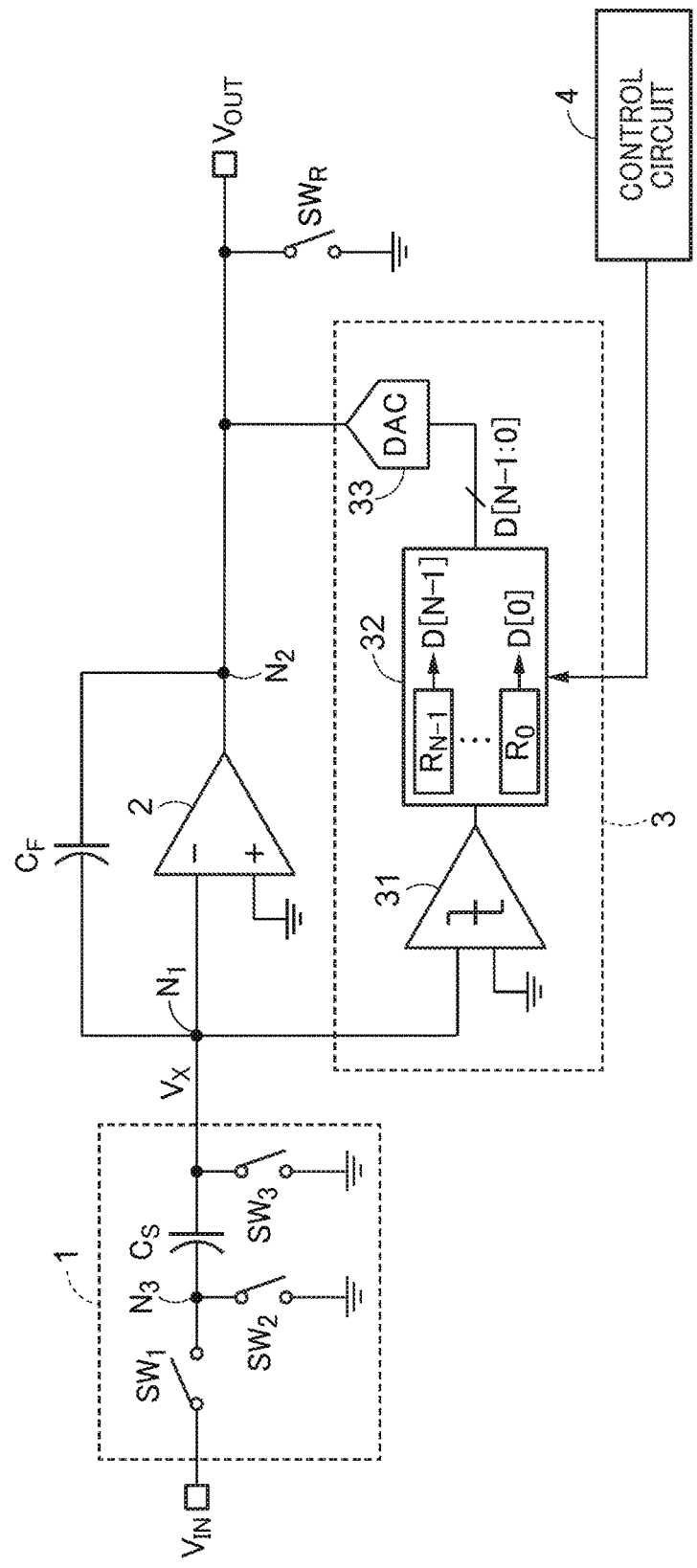
FIG. 1 is a diagram showing an example of an amplifier circuit according to a first embodiment.

According to one embodiment, an amplifier circuit has a sample-and-hold circuit to sample and hold an input signal, an amplifier which comprises an input terminal inputted with the input signal held by the sample-and-hold circuit and an output terminal outputting an amplification signal obtained by amplifying the input signal inputted, a feedback capacitor to be connected between the input terminal and output terminal of the amplifier, a successive approximation circuit to perform successive approximation operation to correct the amplification signal based on a voltage of the input terminal of the amplifier, the successive approximation operation being performed a predetermined number of cycles, and a control circuit to control the successive approximation circuit based on an amplification error included in the amplification signal.

Hereinafter, embodiments will be explained referring to the drawings.

First Embodiment

An amplifier circuit according to a first embodiment will be explained referring to FIGS. 1 to 8. The amplifier circuit according to the present embodiment amplifies a signal inputted thereto by a predetermined amplification factor and outputs the amplified signal. The signal inputted into the amplifier circuit is referred to as "input signal," and the signal outputted by the amplifier circuit is referred to as "amplification signal." In the following, the input signal is defined as a voltage signal $V_{IN}$, the amplification signal is defined as a voltage signal $V_{OUT}$, and the amplification factor of the amplifier circuit is defined as G. When the amplification signal $V_{OUT}$ has no amplification error, $V_{OUT}=G \times V_{IN}$. Note that each of the input signal and output signal should not be limited to the voltage signal, and may be a current signal instead.

First, a configuration of the amplifier circuit according to the present embodiment will be explained referring to FIG. 1. FIG. 1 is a diagram showing an example of the amplifier circuit according to the present embodiment. The amplifier circuit of FIG. 1 has a sample-and-hold circuit 1, an amplifier 2, a feedback capacitor $C_F$, a reset switch $SW_R$, a successive approximation circuit 3, and a control circuit 4.

The sample-and-hold circuit (S/H) 1 samples and holds the input signal $V_{IN}$. The sample-and-hold circuit 1 has an input terminal inputted with the input signal $V_{IN}$ and an output terminal connected to a node $N_1$. The input terminal of the sample-and-hold circuit 1 corresponds to an input terminal of the amplifier circuit. The node $N_1$ corresponds to the output terminal of the sample-and-hold circuit 1, and serves as a connecting point of the output terminal of the sample-and-hold circuit 1, an inverting input terminal of the amplifier 2, one end of the feedback capacitor $C_F$, and an input terminal of the successive approximation circuit 3. In the following, the voltage of the node $N_1$ is referred to as a virtual ground voltage $V_X$.

In the example of FIG. 1, the sample-and-hold circuit 1 is a switched capacitor circuit having switches $SW_1$ to $SW_3$ and a sampling capacitor $C_S$.

One end of the switch $SW_1$ is connected to a node $N_3$ and the other end thereof is connected to the input terminal of the sample-and-hold circuit 1. The node $N_3$ is a connecting point of one end of the switch $SW_1$, one end of the switch $SW_2$, and one end of the sampling capacitor $C_S$.

One end of the switch $SW_2$ is connected to the node $N_3$ and the other end thereof is connected to a reference voltage line applied with a reference voltage. In the following explanation, the reference voltage means ground voltage (=0) and the reference voltage line is a ground line, but the reference voltage and reference voltage line should not be limited thereto.

One end of the switch $SW_3$ is connected to the node $N_1$ and the other end thereof is connected to a ground line (i.e., grounded.)

One end of the sampling capacitor $C_S$ having a capacitance value $C_S$ is connected to the node $N_3$ and the other end thereof is connected to the node $N_1$. The voltage of the other end of the sampling capacitor $C_S$ becomes the virtual ground voltage $V_X$.

Note that the configuration of the sample-and-hold circuit 1 should not be limited to the configuration of FIG. 1. As the sample-and-hold circuit 1, an existing circuit capable of sampling and holding the input signal $V_{IN}$ can be arbitrarily used.

The amplifier 2 is an operational amplifier having a gain A, and has an inverting input terminal connected to the node $N_1$, a non-inverting input terminal which is grounded, and an output terminal connected to a node $N_2$. The node $N_2$ is a connecting point of the output terminal of the amplifier 2, the other end of the feedback capacitor $C_F$, one end of the reset switch $SW_R$, and an output terminal of the successive approximation circuit 3. The voltage of the node $N_2$ (the voltage of an output terminal of the amplifier circuit) becomes the amplification signal $V_{OUT}$.

Note that, in the example of FIG. 1, the amplifier 2 is an operational amplifier, but the amplifier 2 should not be limited thereto. As the amplifier 2, an existing amplifier which can be used in a so-called closed-loop switched capacitor circuit can be arbitrarily used. For example, the amplifier 2 may be a comparator-based amplifier, or may be a ring amplifier.

One end of the feedback capacitor $C_F$ having a capacitance value $C_F$ is connected to the node $N_1$ and the other end thereof is connected to the node $N_2$. That is, the feedback capacitor $C_F$ is connected between the inverting input terminal and output terminal of the amplifier 2. In the example of FIG. 1, the amplification factor G of the amplifier circuit is set based on the capacitance values $C_S$ and $C_F$. The ideal amplification factor G when no amplification error occurs can be expressed as $C_S/C_F$. One end of the reset switch $SW_R$ is connected to the node $N_2$ and the other end thereof is grounded.

The successive approximation circuit 3 corrects the amplification signal $V_{OUT}$ outputted by the amplifier 2. Here, the correction means changing the amplification signal $V_{OUT}$ so that the amplification signal $V_{OUT}$ approaches an ideal value, i.e., so that the amplification error approaches 0.

The successive approximation circuit 3 has an input terminal connected to the node $N_1$ and an output terminal connected to the node $N_2$. The successive approximation circuit 3 performs successive approximation operation. The successive approximation operation means a series of actions to change the voltage (amplification signal $V_{OUT}$) of the output terminal of the amplifier 2 so that the voltage (virtual ground voltage $V_X$) of the inverting input terminal of the amplifier 2 approaches the ground voltage (reference voltage).

The successive approximation circuit 3 corrects the amplification signal $V_{OUT}$ by performing such a successive approximation operation a plurality of number of cycles. In the following, the number of cycles of the successive approximation operation performed by the successive approximation circuit 3 is defined as n. The successive approximation circuit 3 has a comparator 31, a logic circuit 32, and a DAC (Digital to Analog Converter) 33.

The comparator 31 has a first input terminal connected to the node $N_1$, a second input terminal which is grounded, and an output terminal connected to an input terminal of the logic circuit 32. The first input terminal of the comparator 31 corresponds to the input terminal of the successive approximation circuit 3. The comparator 31 compares the virtual ground voltage $V_X$ applied to the first input terminal with the ground voltage applied to the second input terminal to output a comparison result. The comparison result is outputted as a binary digital signal (1 or 0). Note that the first input terminal and the second input terminal may be an inverting input terminal and a non-inverting input terminal respectively, or may be a non-inverting input terminal and an inverting input terminal respectively.

The logic circuit 32, which is a digital circuit to switch each cycle of the successive approximation operation and to manage the number of cycles, has an input terminal connected to the output terminal of the comparator 31 and an output terminal connected to an input terminal of the DAC 33. The logic circuit 32 is inputted with a comparison result from the comparator 31 through its input terminal, and outputs an N-bit (N≥n) digital signal D[N−1:0] from its output terminal.

The logic circuit 32 has N registers $R_i$ (i=0 to N−1). The register $R_i$ stores a comparison result (digital value) obtained in the successive approximation operation in the (n−i)-th cycle, and outputs the stored comparison result. The comparison result outputted by the register $R_i$ corresponds to D[i] as the (N−i)-th bit in the digital signal D[N−1:0].

For example, the output signal of a register $R_0$ corresponds to D[0] as the N-th bit in the digital signal D[N−1:0]. The bit D[0] is the LSB (Least Significant Bit) of the digital signal D[N−1:0]. Further, the output signal of a register $R_{N-1}$ corresponds to D[N−1] as the first bit in the digital signal D[N−1:0]. The bit D[N−1] is the MSB (Most Significant Bit) of the digital signal D[N−1:0].

For example, when N=n=4 and the comparison result in each of the first and second cycles is 1 and the comparison result in each of the third and fourth cycles is 0, D[3]=D[2]=1 and D[1]=D[0]=0, which means that the digital signal D[3:0] shows 1100.

The DAC 33, which is a DAC capable of performing N-bit DA conversion, has an input terminal connected to the output terminal of the logic circuit 32 and an output terminal connected to the node $N_2$. The DAC 33 is inputted with the digital signal D[N−1:0] through its input terminal, and changes the voltage (amplification signal $V_{OUT}$) of the node $N_2$ depending on the inputted digital signal D[N−1:0]. The DAC 33 may be a capacitive DAC, or may be a resistive DAC.

Figure 2:
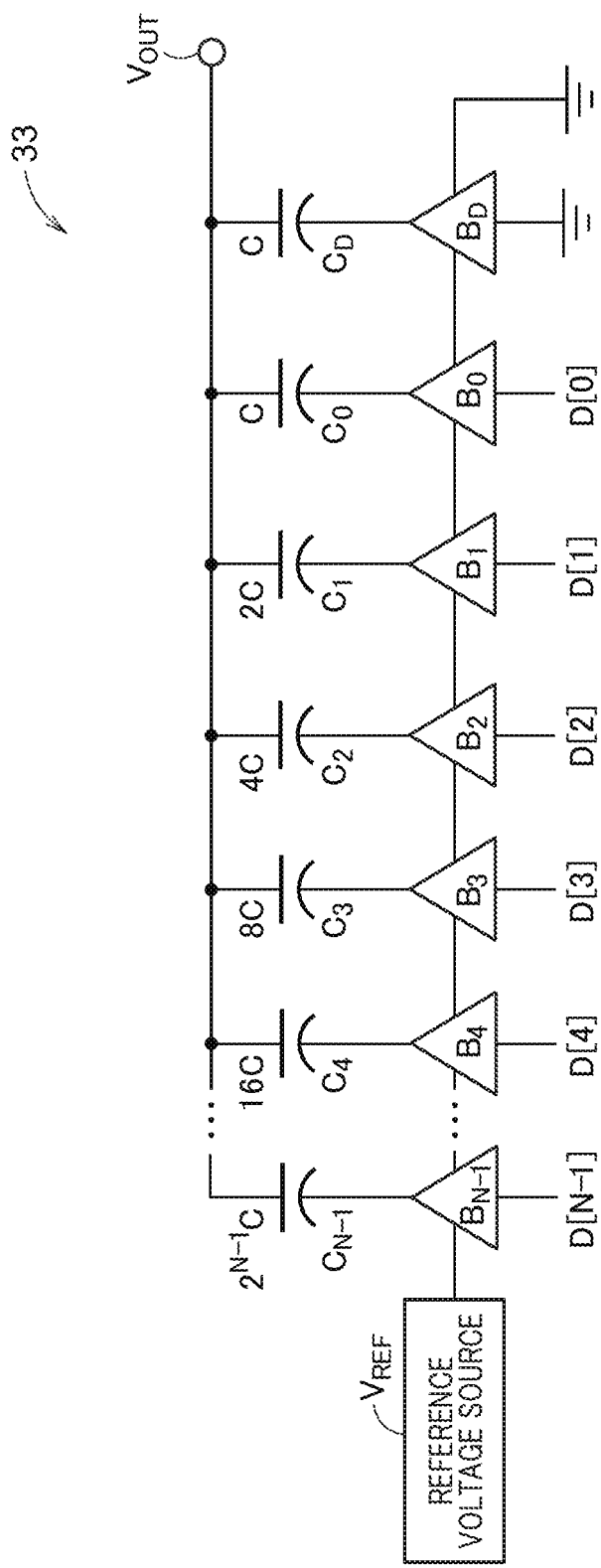
FIG. 2 is a diagram showing an example of a DAC of FIG. 1.

Here, FIG. 2 is a diagram showing an example of the DAC 33. The DAC 33 of FIG. 2 is an N-bit capacitive DAC having N capacitors $C_i$ (i=0 to N−1), a dummy capacitor $C_D$, N buffers $B_i$ (i=0 to N−1), a buffer $B_D$, and a reference voltage source $V_{REF}$.

One end of the capacitor $C_i$ having a capacitance value $C_i$ is connected to the node $N_2$ and the other end thereof is connected to an output terminal of the buffer $B_i$. The capacitance value $C_i$ can be expressed as $2^i \times C$.

One end of the dummy capacitor $C_D$ having a capacitance value C is connected to the node $N_2$ and the other end thereof is connected to an output terminal of the buffer $B_D$.

The buffer $B_i$, which is a buffer for driving the capacitor $C_i$, has an input terminal connected to an output terminal of the register $R_i$ and an output terminal connected to the other end of the capacitor $C_i$.

The buffer $B_D$, which is a buffer for driving the capacitor $C_D$, has an input terminal which is grounded and an output terminal connected to the other end of the dummy capacitor $C_D$.

The reference voltage source $V_{REF}$, which is a power source for driving the buffers $B_i$ and $B_D$, applies a reference voltage $V_{REF}$ to the buffers $B_i$ and $B_D$.

The buffer $B_i$ is inputted with a bit D[i] through its input terminal, and applies a voltage depending on the value of the inputted bit D[i] to the other end of the capacitor $C_i$. When D[i]=0, the buffer $B_i$ applies the ground voltage (=0) to the other end of the capacitor $C_i$, and when D[i]=1, the buffer $B_i$ applies the reference voltage $V_{REF}$ to the other end of the capacitor $C_i$. Since the buffer $B_D$ is grounded, the voltage of the other end of the dummy capacitor $C_D$ is constantly at the ground voltage.

In this way, the DAC 33 of FIG. 2 changes the voltage of the other end of each capacitor $C_i$ depending on the value of the digital signal D[N−1:0]. This causes redistribution of charges and the amplification signal $V_{OUT}$ changes by the amount of change depending on the reference voltage $V_{REF}$ and capacitance value C.

In the following, the amount of change in the amplification signal $V_{OUT}$ produced by a capacitor $C_0$ is referred to as an LSB voltage $V_{LSB}$. The LSB voltage $V_{LSB}$ corresponds to the amount of change in the amplification signal $V_{OUT}$ produced by the LSB of the digital signal D[N−1:0], i.e., the minimum value of the amount of change in the amplification signal $V_{OUT}$ in the successive approximation operation. In the DAC 33 of FIG. 2, the capacitance value $C_i$ is set as binary, by which the amount of change in the amplification signal $V_{OUT}$ produced by the capacitor $C_i$ can be expressed as $2^i \times V_{LSB}$.

A voltage range $V_{RANGE}$ in which the amplification signal $V_{OUT}$ can be corrected by the successive approximation circuit 3 is determined depending on the reference voltage $V_{REF}$ and capacitance value $C_i$ and can be expressed by the following formula.

$$V_{RANGE} = V_{ref} \times \frac{\sum_{i=0}^{n-1} C_i}{C_{SUM} + \sum_{i=0}^{N-1} C_i} \quad (1)$$

In Formula (1), $C_{SUM}$ represents the total capacitance value of the capacitors connected to the node N, excepting the capacitors $C_i$. The capacitance value $C_{SUM}$ is determined based on the capacitance values $C_F$, $C_D$, etc. The LSB voltage $V_{LSB}$ corresponds to the voltage range $V_{RANGE}$ when n=1 in Formula (1).

The control circuit 4 controls the successive approximation circuit 3 based on the amplification error in the amplification signal $V_{OUT}$. In the present embodiment, the control circuit 4 sets a value depending on the amplification error as the number of cycles n of the successive approximation operation performed by the successive approximation circuit 3. The successive approximation circuit 3 performs successive approximation operation n cycles set by the control circuit 4. The control circuit 4 will be mentioned in detail later.

Next, the operation of the amplifier circuit according to the present embodiment will be explained referring to FIGS. 3 to 5. The following explanation is based on the assumption that the number of cycles n is already set by the control circuit 4. Further, the DAC 33 is the capacitive DAC of FIG. 2.

Figure 3:
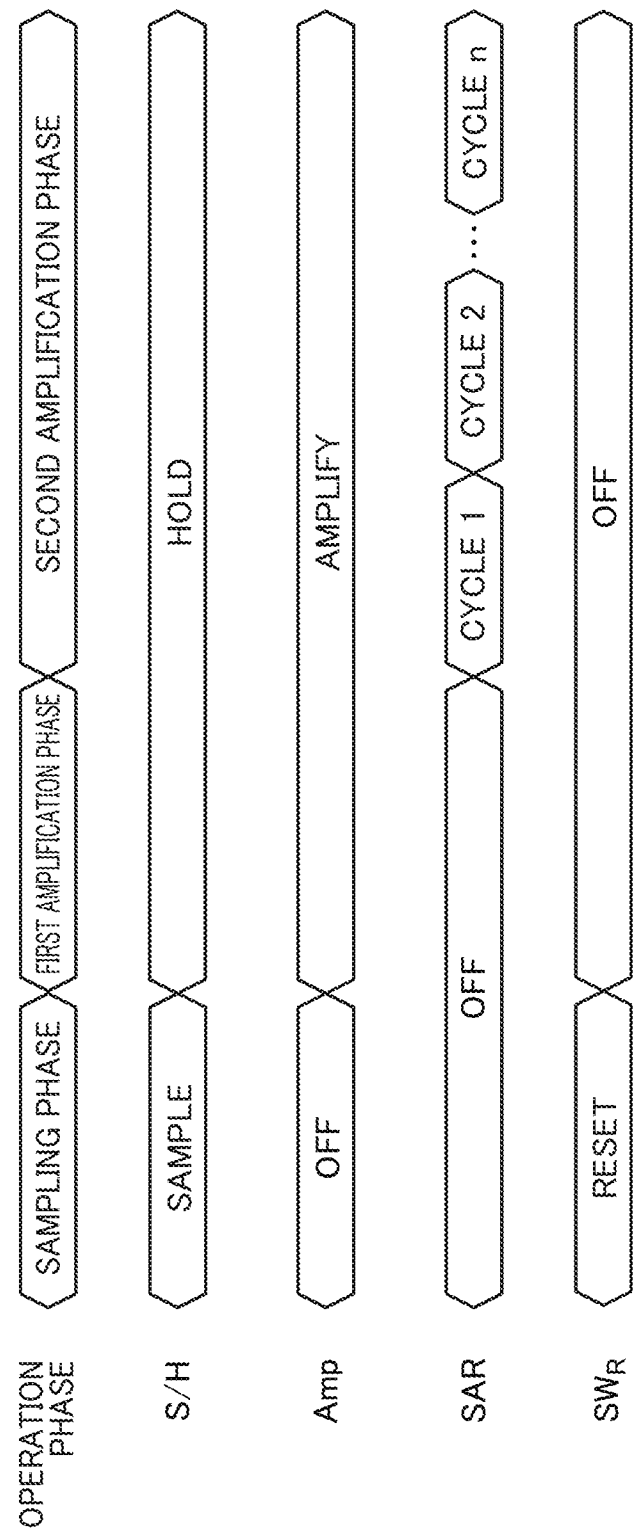
FIG. 3 is a timing chart showing an operation of the amplifier circuit according to the first embodiment.
Figure 4:
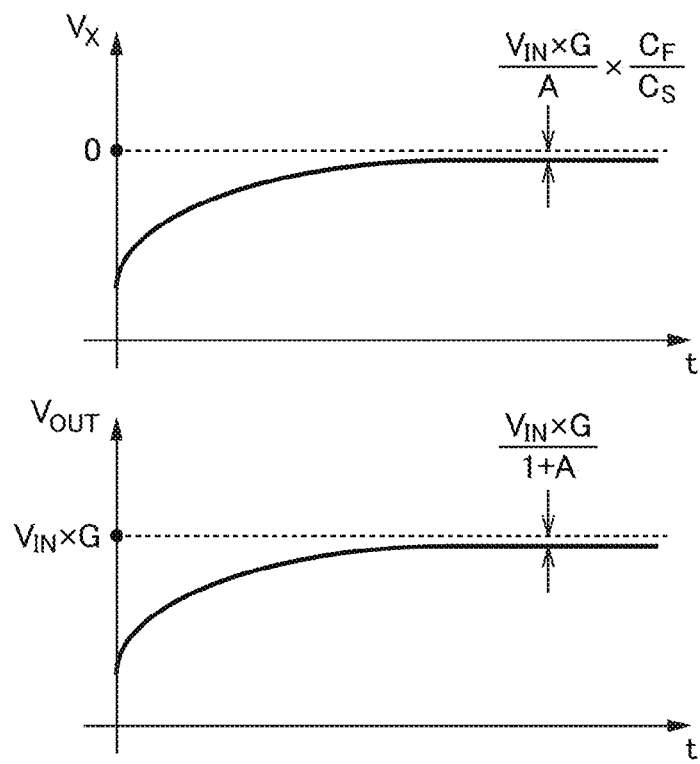
FIG. 4 is a graph showing the virtual ground voltage and amplification signal in a first amplification phase.

FIG. 3 is a timing chart showing the operation of the amplifier circuit. In FIG. 3, S/H represents the sample-and-hold circuit 1, Amp represents the amplifier 2, SAR represents the successive approximation circuit 3, and $SW_R$ represents the reset switch $SW_R$. As shown in FIG. 3, the amplifier circuit has three operation phases including a sampling phase, a first amplification phase, and a second amplification phase.

(Sampling Phase)

The sampling phase is an operation phase in which the sample-and-hold circuit 1 samples the input signal $V_{IN}$. Concretely, in the sample-and-hold circuit 1, the switch $SW_1$ and $SW_3$ are turned on and the switch $SW_2$ is turned off, by which the sampling capacitor $C_S$ samples the input signal $V_{IN}$. That is, a charge Q ($=V_{IN} \times C_S$) depending on the input signal $V_{IN}$ is stored in the sampling capacitor $C_S$.

At this time, since the switch $SW_3$ is turned on, the virtual ground voltage $V_X$ becomes 0. Therefore, the amplifier 2 does not perform amplifying operation (OFF). Further, the successive approximation circuit 3 does not perform successive approximation operation (OFF).

Further, the reset switch $SW_R$ resets the feedback capacitor $C_F$. Concretely, the reset switch $SW_R$ is turned on to discharge the feedback capacitor $C_F$. The reset switch $SW_R$ may be turned on only for a partial period in the sampling phase. After resetting the feedback capacitor $C_F$, the reset switch $SW_R$ is turned off until the next sampling phase (OFF).

(First Amplification Phase) The first amplification phase is an operation phase to roughly amplify the input signal $V_{IN}$ by the amplifying operation of the amplifier 2. In the first amplification phase, the successive approximation circuit 3 does not perform successive approximation operation (OFF). After the sampling phase ends, the first amplification phase starts.

When the first amplification phase starts, the sample-and-hold circuit 1 holds the input signal $V_{IN}$ sampled at the end of the sampling phase. Concretely, in the sample-and-hold circuit 1, the switches $SW_1$ and $SW_3$ are turned off and the switch $SW_2$ is turned on, by which the input signal $V_{IN}$ sampled in the sampling capacitor $C_S$ at the end of the sampling phase is held. That is, the sampling capacitor $C_S$ retains the charge Q stored at the end of the sampling phase. After that, the sample-and-hold circuit 1 continuously holds the input signal $V_{IN}$ until the next sampling phase starts.

When the sample-and-hold circuit 1 holds the input signal $V_{IN}$, the virtual ground voltage $V_X$ becomes a voltage depending on the charge Q retained by the sampling capacitor $C_S$. Concretely, the virtual ground voltage $V_X$ becomes $-V_{IN}$. Since the virtual ground voltage $V_X$ is no longer 0, the amplifier 2 performs amplifying operation. When the amplifier 2 performs amplifying operation, the charge Q stored in the sampling capacitor $C_S$ is transferred to the feedback capacitor $C_F$, and the virtual ground voltage $V_X$ approaches 0 as shown in FIG. 4.

When the amplifier 2 is an ideal amplifier (the gain A is infinite), all the charge Q is transferred from the sampling capacitor $C_S$ to the feedback capacitor $C_F$ by the amplifying operation of the amplifier 2. Consequently, the virtual ground voltage $V_X$ becomes 0, and the amplification signal $V_{OUT}$ becomes $Q/C_F = V_{IN} \times C_S/C_F = V_{IN} \times G$. That is, an ideal amplification signal $V_{OUT}$ obtained by amplifying the input signal $V_{IN}$ by G times is outputted.

However, since the gain A of the amplifier 2 is actually finite, not all the charge Q is transferred from the sampling capacitor $C_S$ to the feedback capacitor $C_F$. Consequently, even when the amplifier 2 performs amplifying operation, an error of at least $(V_{IN} \times G \times C_F)/(A \times C_S)$ occurs in the virtual ground voltage $V_X$ as shown in FIG. 4. Accompanying with the error in the virtual ground voltage $V_X$, an amplification error of at least $V_{IN} \times G/(1+A)$ occurs in the amplification signal $V_{OUT}$.

Since the time of the first amplification phase is actually finite, at the end of the first amplification phase, the error in the virtual ground voltage $V_X$ becomes larger than $(V_{IN} \times G \times C_F)/(A \times C_S)$ and the amplification error in the amplification signal $V_{OUT}$ becomes larger than $V_{IN} \times G/(1+A)$.

As stated above, in the first amplification phase, an amplification error depending on the performance (gain A) of the amplifier 2 occurs in the amplification signal $V_{OUT}$. This similarly occurs also when the amplifier 2 is not an operational amplifier but a comparator-based amplifier. When the amplifier 2 is a comparator-based amplifier, in the first amplification phase, an amplification error depending on the performance (finite time) of a comparator included in the amplifier 2 occurs in the amplification signal $V_{OUT}$.

(Second Amplification Phase)

The second amplification phase is an operation phase in which the successive approximation circuit 3 corrects the amplification error included in the amplification signal $V_{OUT}$ at the end of the first amplification phase. After the first amplification phase ends, the second amplification phase starts. Note that, as mentioned above, since the virtual ground voltage $V_X$ does not become 0 at the end of the first amplification phase, the amplifier 2 performs amplifying operation also in the second amplification phase.

In the second amplification phase, the successive approximation circuit 3 performs successive approximation operation. In the following, a concrete example of the successive approximation operation will be explained referring to FIG. 5. Here, it is assumed that N=n=4 for explanation.

First, in the successive approximation operation in the first cycle (Cycle 1), the logic circuit 32 outputs 1000 as a digital signal D[3:0], by which the reference voltage $V_{REF}$ is applied to a capacitor $C_3$ of the DAC 33 and the amplification signal $V_{OUT}$ changes by $8V_{LSB}$. Accompanying with the change in the amplification signal $V_{OUT}$, the virtual ground voltage $V_X$ also changes.

The comparator 31 compares the virtual ground voltage $V_X$ thus changed with the ground voltage (=0) to output a comparison result. When $V_X<0$, the comparator 31 outputs 1, and when $V_X>0$, the comparator 31 outputs 0. 1 and 0 may be reversed. The comparison result outputted by the comparator 31 in the first cycle is stored in a register $R_3$ of the logic circuit 32. In the example of FIG. 5, since $V_X>0$, the register $R_3$ stores 0. After that, 0 is outputted as a bit D[3].

Next, in the successive approximation operation in the second cycle (Cycle 2), the logic circuit 32 outputs 0100 as the digital signal D[3:0], by which the reference voltage $V_{REF}$ is applied to a capacitor $C_2$ of the DAC 33 and the amplification signal $V_{OUT}$ changes by $4V_{LSB}$. Accompanying with the change in the amplification signal $V_{OUT}$, the virtual ground voltage $V_X$ also changes.

The comparator 31 compares the virtual ground voltage $V_X$ thus changed with the ground voltage (=0) to output a comparison result. The comparison result outputted by the comparator 31 in the second cycle is stored in a register $R_2$ of the logic circuit 32. In the example of FIG. 5, since $V_X<0$, the register $R_2$ stores 1. After that, 0 is outputted as a bit D[2].

After that, in the successive approximation operation in the third cycle (Cycle 3), the logic circuit 32 outputs 0110 as the digital signal D[3:0], by which the reference voltage $V_{REF}$ is applied to a capacitor $C_1$ of the DAC 33 and the amplification signal $V_{OUT}$ changes by $2V_{LSB}$. Accompanying with the change in the amplification signal $V_{OUT}$, the virtual ground voltage $V_X$ also changes.

The comparator 31 compares the virtual ground voltage $V_X$ thus changed with the ground voltage (=0) to output a comparison result. The comparison result outputted by the comparator 31 in the third cycle is stored in a register $R_1$ of the logic circuit 32. In the example of FIG. 5, since $V_X>0$, the register $R_1$ stores 0. After that, 0 is outputted as a bit D[1].

Then, in the successive approximation operation in the fourth cycle (Cycle 4), the logic circuit 32 outputs 0101 as the digital signal D[3:0], by which the reference voltage $V_{REF}$ is applied to the capacitor $C_0$ of the DAC 33 and the amplification signal $V_{OUT}$ changes by $V_{LSB}$. Accompanying with the change in the amplification signal $V_{OUT}$, the virtual ground voltage $V_X$ also changes.

The comparator 31 compares the virtual ground voltage $V_X$ thus changed with the ground voltage (=0) to output a comparison result. The comparison result outputted by the comparator 31 in the fourth cycle is stored in the register $R_0$ of the logic circuit 32. In the example of FIG. 5, since $V_X<0$, the register $R_0$ stores 1. After that, 1 is outputted as a bit D[0].

Figure 5:
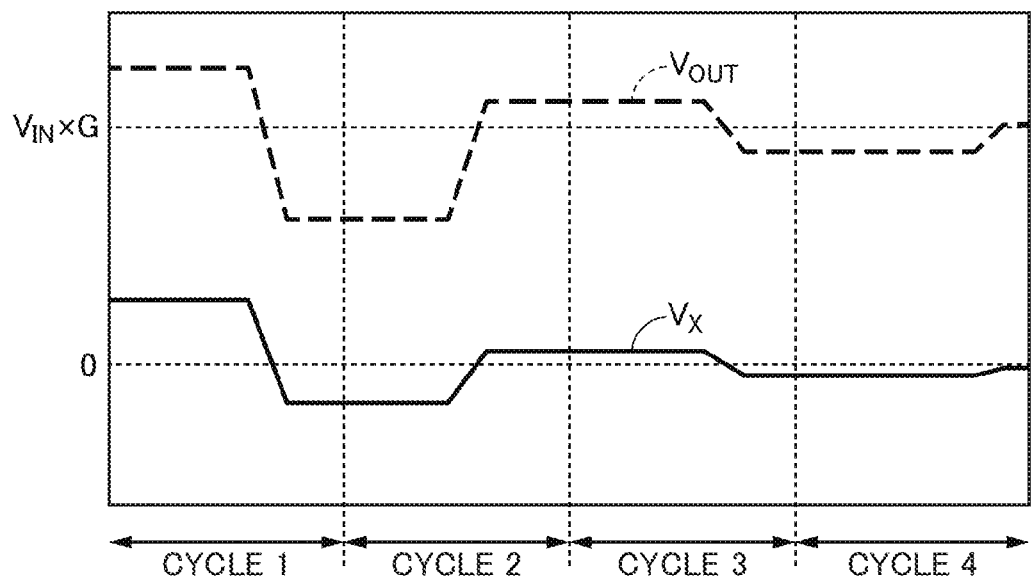
FIG. 5 is a graph showing the virtual ground voltage and amplification signal in a second amplification phase.

As shown in FIG. 5, the above successive approximation operation makes it possible to make the virtual ground voltage $V_X$ approach 0, make the amplification signal $V_{OUT}$ approach an ideal value ($=V_{IN} \times G$), and make the amplification error in the amplification signal $V_{OUT}$ smaller compared to that at the end of the first amplification phase.

After the second amplification phase ends, the registers $R_i$ of the logic circuit 32 and the capacitors $C_i$ of the DAC 33 are reset, and then the next sampling phase starts. The registers $R_i$ and capacitors $C_i$ may be reset after the next sampling phase starts.

As explained above, according to the amplifier circuit in the present embodiment, the successive approximation operation performed by the successive approximation circuit 3 makes it possible to restrain the amplification error in the amplification signal $V_{OUT}$, which leads to the improvement of the amplification accuracy of the input signal $V_{IN}$. Therefore, an amplifier circuit with high amplification accuracy can be realized.

Note that the amplifier circuit in the above explanation has a single-phase configuration, but the amplifier circuit may have a differential configuration.

Hereinafter, the control circuit 4 in the present embodiment will be explained in detail.

Generally, it is desirable to form the successive approximation circuit 3 so that the voltage range $V_{RANGE}$ in which the amplification signal $V_{OUT}$ can be corrected becomes larger than a maximum error $V_{MAX}$. The maximum error $V_{MAX}$ is a maximum value of the amplification error included in the amplification signal $V_{OUT}$ before being corrected by the successive approximation operation. With such a configuration, the amplification error included in the amplification signal $V_{OUT}$ at the end of the successive approximation operation can be made the LSB voltage $V_{LSB}$ or less.

In order to make the voltage range $V_{RANGE}$ larger than the maximum error $V_{MAX}$, the successive approximation circuit 3 must be designed to meet the following formula.

$$n \geq \log_2(V_{MAX}/V_{LSB}) \quad (2)$$

Formula (2) is based on the assumption that the amount of change in the amplification signal $V_{OUT}$ in each successive approximation operation is designed as binary, as in the above successive approximation circuit 3.

As will be understood from Formula (2), when the LSB voltage $V_{LSB}$ is made smaller to improve the correction accuracy of the successive approximation circuit 3 (the amplification accuracy of the amplifier circuit), the number of cycles n required for the successive approximation operation becomes large. As the number of cycles n becomes larger, the second amplification phase becomes longer, which leads to the reduction in the speed of the successive approximation operation. Therefore, the correction accuracy and speed of the successive approximation operation are in a trade-off relationship.

The correction accuracy and speed of the successive approximation operation can be improved at the same time by making the gain A of the amplifier 2 larger while making the maximum error $V_{MAX}$ smaller, but it is difficult to form an amplifier 2 having a sufficiently large gain A by using a minute CMOS.

Accordingly, in order to ensure both of the correction accuracy and speed in the successive approximation operation, it is important to appropriately set the number of cycles n and LSB voltage $V_{SB}$ depending on the maximum error $V_{MAX}$. Accordingly, the control circuit 4 in the present embodiment sets the number of cycles n to an appropriate value depending on the maximum error $V_{MAX}$.

The control circuit 4 sets the number of cycles n so that the voltage range $V_{RANGE}$ becomes larger than the maximum error $V_{MAX}$, for example. That is, the control circuit 4 sets the number of cycles n to a larger value as the maximum error $V_{MAX}$ becomes larger. Due to this, the amplification error in the amplification signal $V_{OUT}$ after being corrected becomes smaller than the LSB voltage $V_{LSB}$, which makes it possible to improve the correction accuracy (amplification accuracy) of the amplification signal $V_{OUT}$.

Further, the control circuit 4 may set the number of cycles n to a smaller value satisfying that the voltage range $V_{RANGE}$ becomes larger than the maximum error $V_{MAX}$. This makes it possible to shorten the second amplification phase to improve the speed of the successive approximation operation while improving the correction accuracy (amplification accuracy).

In order to set the number of cycles n by the above method, the control circuit 4 detects an environmental condition of the amplifier 2. The environmental condition of the amplifier 2 includes a threshold voltage P of a transistor in the amplifier 2, a power-supply voltage V of the amplifier 2, and a temperature T of the amplifier 2 in operation.

This is because the amplification error in the amplification signal $V_{OUT}$ depends on the gain A of the amplifier 2, and the gain A of the amplifier 2 depends on the environmental condition of the amplifier 2. Setting the number of cycles n based on the environmental condition of the amplifier 2 makes it possible to realize the above setting method depending on the maximum error $V_{MAX}$.

Generally, the gain A of the amplifier 2 becomes higher as the threshold voltage P becomes higher, becomes higher as the power-supply voltage V becomes higher, and becomes higher as the temperature T becomes lower. That is, the gain A of the amplifier 2 becomes lower as the threshold voltage P becomes lower, becomes lower as the power-supply voltage V becomes lower, and becomes lower as the temperature T becomes higher. The gain A of the amplifier 2 is greatly influenced by the temperature T, and may change to become about two to three times larger depending on the temperature T.

On the other hand, the speed of the successive approximation operation becomes faster as the threshold voltage P becomes lower, becomes faster as the power-supply voltage V becomes higher, and becomes faster as the temperature T becomes higher. That is, the speed of the successive approximation operation becomes slower as the threshold voltage P becomes higher, becomes slower as the power-supply voltage V becomes lower, and becomes slower as the temperature T becomes lower.

Therefore, the control circuit 4 sets the number of cycles n to a larger value as the threshold voltage of the transistor becomes lower, to a larger value as the power-supply voltage V becomes lower, and to a larger value as the temperature T becomes higher, which makes it possible to set the number of cycles n to a larger value as the maximum error $V_{MAX}$ becomes larger.

The control circuit 4 may detect at least one of the environmental conditions PVT to set the number of cycles n as stated above depending on the detected environmental condition. Concretely, it is desirable that the control circuit 4 has a temperature sensor for detecting the temperature T of the amplifier 2 in order to set the number of cycles n based on the temperature T detected by the temperature sensor. This is because the temperature T has a large influence on the gain A of the amplifier 2.

The control circuit 4 should set the number of cycles n to a larger value as the temperature T becomes higher. More specifically, it is desirable for the control circuit 4 to set the number of cycles n based on the temperature T so that the number of cycles n becomes minimum satisfying that the voltage range $V_{RANGE}$ becomes larger than the maximum error $V_{MAX}$. The minimum number of cycles n satisfying that the voltage range $V_{RANGE}$ becomes larger than the maximum error $V_{MAX}$ should be previously set through experiment and simulation.

Since the control circuit 4 sets the number of cycles n in this way, the amplification error in the amplification signal $V_{OUT}$ after being corrected becomes smaller than the LSB voltage $V_{LSB}$, which leads to the improvement of correction accuracy. Further, since the speed of the successive approximation operation becomes higher as the temperature T becomes higher, it is possible to prevent the second amplification phase from becoming longer due to the increase in the number of cycles n. Furthermore, since the number of cycles n is set smaller as the temperature T becomes lower, unnecessary successive approximation operation is not performed, which leads to the reduction in the power consumption of the successive approximation operation.

Figures 6, 7:
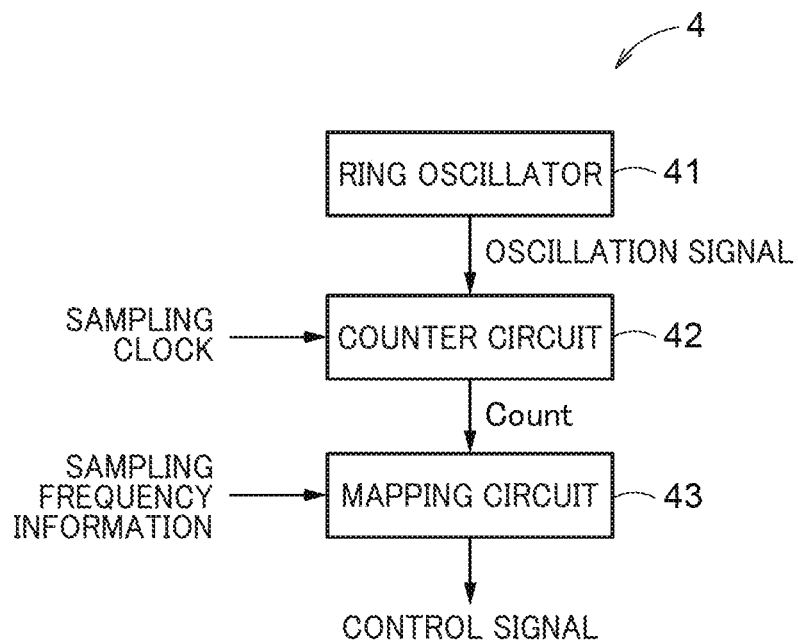
FIG. 6 is a diagram showing an example of a control circuit of FIG. 1.
FIG. 7 is a diagram showing an example of a mapping table.

Instead of detecting the environmental conditions PVT directly as stated above, the control circuit 4 may detect parameters depending on the environmental conditions PVT to set the number of cycles n depending on the detected parameters. FIG. 6 is a diagram showing an example of such a control circuit 4.

The control circuit 4 of FIG. 6 detects the number of oscillations of a ring oscillator in a predetermined period, as a parameter depending on the environmental conditions PVT. The control circuit 4 has a ring oscillator 41, a counter circuit 42, and a mapping circuit 43.

The ring oscillator 41 is formed of an odd number of inverters connected in a ring shape. Generally, the number of oscillations (free running frequency) of the ring oscillator 41 is easily influenced by the environmental conditions PVT, and thus the number of oscillations of the ring oscillator 41 can be used as a parameter to detect the environmental conditions PVT indirectly. The ring oscillator 41 can be manufactured in an extremely small size and at low cost through a miniaturization process. The oscillation signal of the ring oscillator 41 is inputted into the counter circuit 42.

The counter circuit 42 counts the number of oscillations of the ring oscillator 41 in a predetermined period. The counter circuit 42 is inputted with e.g. a sampling clock for starting the sampling phase, and counts the number of oscillations in the period between the inputted sampling clocks. In this way, the number of oscillations at a sampling frequency fs can be counted. The counter circuit 42 inputs a count value Count into the mapping circuit 43.

The mapping circuit 43 has a mapping table defining the relationship between an optimum number of oscillations at a reference frequency f and the number of cycles n. The optimum number of oscillations can be previously set through experiment and simulation.

Further, the mapping circuit 43 acquires sampling frequency information from a PLL (Phase Locked Loop) etc. provided in the outside. The sampling frequency information is information showing the sampling frequency fs.

The mapping circuit 43 calculates a count value $Count_2$ of the number of oscillations at the reference frequency f, based on the count value Count inputted from the counter circuit 42 and on the sampling frequency information. The count value $Count_2$ is calculated by the following formula.

$$Count_2 = Count \times \frac{f}{fs} \quad (3)$$

In this way, the influence of variation in the sampling frequency fs can be removed from the count value Count. Then, the mapping circuit 43 refers to the mapping table based on the calculated count value $Count_2$ to determine an optimum number of cycles n. The mapping circuit 43 outputs a control signal for setting the determined number of cycles n in the successive approximation circuit 3. The control signal is inputted into the successive approximation circuit 3. The control signal will be mentioned later.

FIG. 7 is a diagram showing an example of the mapping table. In the example of FIG. 7, the number of cycles n is set to 3 when the count value $Count_2$ is 4 or less (when the environmental condition is low speed), the number of cycles n is set to 5 when the count value $Count_2$ is 5 or greater and 19 or less (when the environmental condition is normal speed), and the number of cycles n is set to 7 when the count value $Count_2$ is 20 or greater (when the environmental condition is high speed).

The condition of low speed is an environmental condition showing that the threshold voltage P of the transistor is high, the temperature T is low, and the power-supply voltage V is low, for example. Under the condition of low speed, the speed of the successive approximation operation decreases and the gain A of the amplifier 2 becomes large, by which correction accuracy can be kept with a small number of cycles n. Therefore, under the condition of low speed, it is desirable to set the number of cycles n small.

On the other hand, the condition of high speed is an environmental condition showing that the threshold voltage P of the transistor is low, the temperature T is high, and the power-supply voltage V is low, for example. Under the condition of high speed, the gain of the amplifier 2 decreases and the number of cycles of the successive approximation operation which can be performed in the second amplification phase becomes large, which makes it possible to prevent the second amplification phase from becoming longer although the number of cycles n is large. Therefore, under the condition of high speed, it is desirable to set the number of cycles n large.

Note that, in the example of FIG. 7, the number of cycles n is set to three types of values (3, 5, and 7) depending on the number of oscillations of the ring oscillator (the environmental conditions PVT), but the number of cycles n may be set to two types of values, or may be set to four or more types of values.

Figure 8:
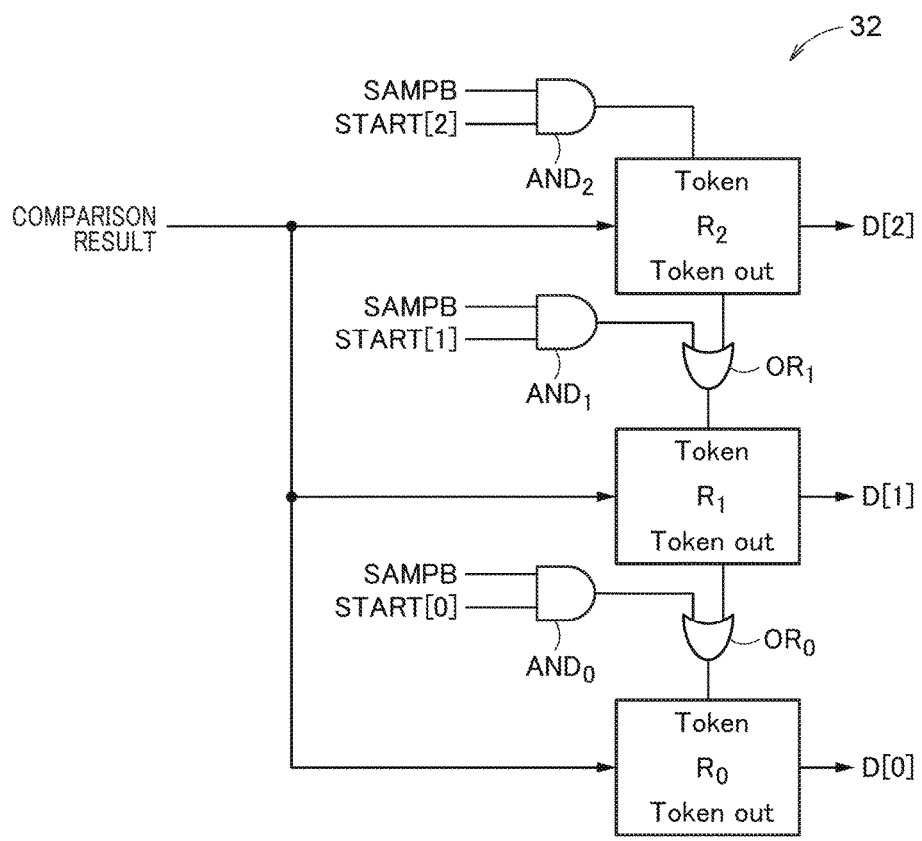
FIG. 8 is a diagram showing an example of a logic circuit of FIG. 1.

Hereinafter, how to set the number of cycles n will be concretely explained referring to FIG. 8. FIG. 8 is a diagram showing an example of the logic circuit 32 of the successive approximation circuit 3. The logic circuit 32 of FIG. 8 has registers $R_0$ to $R_2$, AND gates $AND_0$ to $AND_2$, and OR gates $OR_0$ and $OR_1$, and sets the number of cycles n by a control signal START[2:0] outputted by the control circuit 4. In the example of FIG. 8, the control signal START[2:0] is a 3-bit digital signal. START[2] is the first bit (MSB) of the control signal START[2:0], and START[0] is the third bit (LSB) of the control signal START[2:0].

The AND gate $AND_2$ is inputted with a clock SAMPB for starting the second amplification phase and START[2]. The output signal of the AND gate $AND_2$ is inputted into the register $R_2$ as an input token (Token).

The AND gate $AND_1$ is inputted with the clock SAMPB and START[1]. The output signal of the AND gate $AND_1$ is inputted into the OR gate $OR_1$.

The AND gate $AND_0$ is inputted with the clock SAMPB and START[0]. The output signal of the AND gate $AND_0$ is inputted into the OR gate $OR_0$.

The OR gate $OR_1$ is inputted with the output token (Token out) of the register $R_2$ and the output signal of the AND gate $AND_1$. The output signal of the OR gate $OR_1$ is inputted into the register $R_1$ as an input token.

The OR gate $OR_0$ is inputted with the output token of the register $R_1$ and the output signal of the AND gate $AND_0$. The output signal of the OR gate $OR_0$ is inputted into the register $R_0$ as an input token.

When inputted with 1 as an input token, each register $R_i$ changes bit D[i] to 1, by which the reference voltage $V_{REF}$ is applied to the capacitor $C_i$ and the amplification signal $V_{OUT}$ changes by $2^i \times V_{LSB}$. Accompanying with the change in the amplification signal $V_{OUT}$, the virtual ground voltage $V_X$ also changes.

The comparator 31 compares the virtual ground voltage $V_X$ thus changed with the ground voltage (=0) to output a comparison result. The register $R_i$ stores the comparison result outputted by the comparator 31 and outputs 1 as an output token.

Therefore, when START[2:0]=100, the successive approximation operation is started from the register $R_2$ and performed three cycles (n=3). When START[2:0]=010, the successive approximation operation is started from the register $R_1$ and performed two cycles (n=2). When START[2:0]=001, the successive approximation operation is started from the register $R_0$ and performed one cycle (n=1). That is, the control circuit 4 can control the number of cycles n by the control signal START[2:0].

When the logic circuit 32 has N registers $R_i$ (i=0 to N−1), the control circuit 4 should output an N-bit control signal START[N−1:0] in which only START[n−1] is 1, by which the successive approximation operation is started from the register $R_{n-1}$ and the successive approximation circuit 3 performs the successive approximation operation n cycles.

Second Embodiment

An amplifier circuit according to a second embodiment will be explained referring to FIG. 9. In the first embodiment, the control circuit 4 detects an environmental condition and controls the number of cycles n of the successive approximation operation based on the detected environmental condition. On the other hand, in the present embodiment, the control circuit 4 detects an environmental condition and controls the reference voltage $V_{REF}$ of the DAC 33 based on the detected environmental condition.

Figure 9:
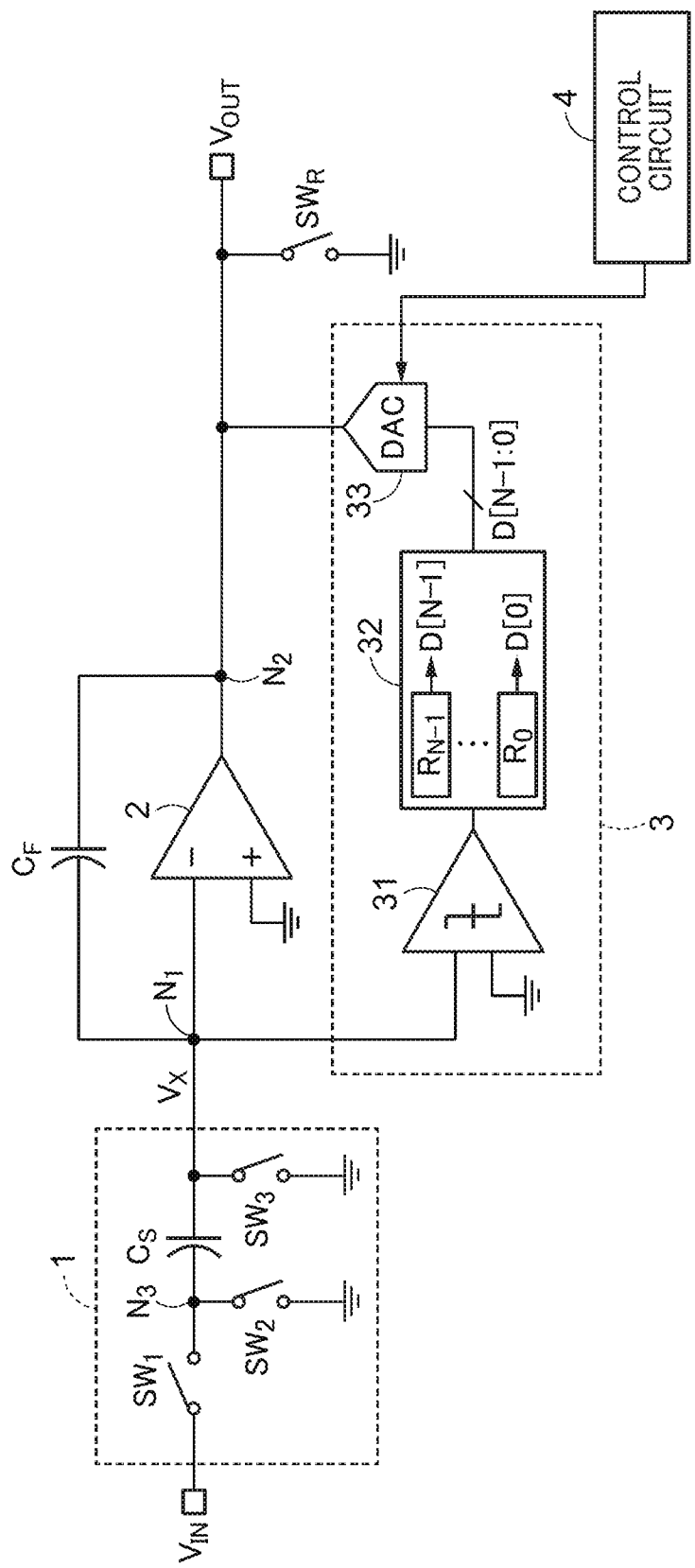
FIG. 9 is a diagram showing an example of an amplifier circuit according to a second embodiment.

FIG. 9 is a diagram showing an example of an amplifier circuit according to the present embodiment. As shown in FIG. 9, the control circuit 4 inputs a control signal for controlling the reference voltage source $V_{REF}$ into the DAC 33. Based on this control signal, the reference voltage $V_{REF}$ of the reference voltage source $V_{REF}$ is set. That is, in the present embodiment, the reference voltage source $V_{REF}$ is a voltage source having a variable reference voltage $V_{REF}$. Further, the number of cycles n is constant. The other components are similar to those of the first embodiment.

The control circuit 4 in the present embodiment sets the reference voltage $V_{REF}$ so that the voltage range $V_{RANGE}$ becomes larger than the maximum error $V_{MAX}$. That is, the control circuit 4 sets the reference voltage $V_{REF}$ to a higher value as the maximum error $V_{MAX}$ becomes larger. Due to this, the amplification error in the amplification signal $V_{OUT}$ after being corrected becomes smaller than the LSB voltage $V_{LSB}$, which makes it possible to improve the correction accuracy (amplification accuracy) of the amplification signal $V_{OUT}$.

Further, in the present embodiment, since the reference voltage $V_{REF}$ is set lower as the maximum error $V_{MAX}$ becomes smaller, the LSB voltage $V_{LSB}$ becomes smaller. Accordingly, the correction accuracy (amplification accuracy) of the amplification signal $V_{OUT}$ can be further improved as the maximum error $V_{MAX}$ becomes smaller.

Note that, in the present embodiment, the maximum error $V_{MAX}$ is estimated in a method similar to the first embodiment. That is, the control circuit 4 should detect the environmental conditions PVT or parameters depending on the environmental conditions PVT to estimate the maximum error $V_{MAX}$ based on the detection result.

Further, the control circuit 4 may perform the control of the number of cycles n in the first embodiment and the control of the reference voltage $V_{REF}$ in the present embodiment at the same time. This makes it possible to further improve amplification accuracy while increasing the speed of the successive approximation operation similarly to the first embodiment.

Third Embodiment

An amplifier circuit according to a third embodiment will be explained referring to FIGS. 10 and 11. In the first and second embodiments, the control circuit 4 detects an environmental condition and controls the successive approximation circuit 3 based on the detected environmental condition. On the other hand, in the present embodiment, the control circuit 4 gradually increases the number of cycles n and makes the successive approximation circuit 3 repeatedly correct the amplification signal $V_{OUT}$ in order to search the number of cycles n allowing the voltage range $V_{RANGE}$ to become larger than the maximum error $V_{MAX}$.

Figure 10:
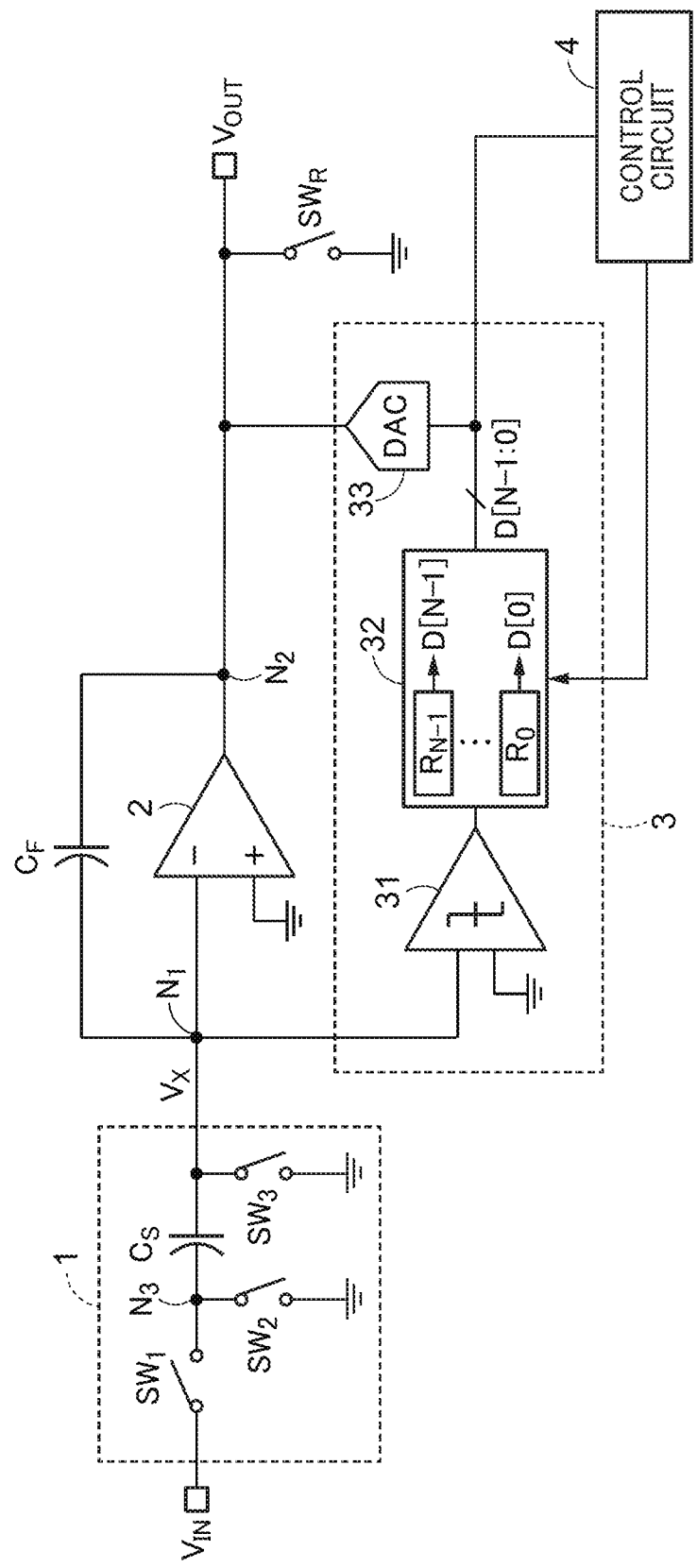
FIG. 10 is a diagram showing an example of an amplifier circuit according to a third embodiment.
Figure 11:
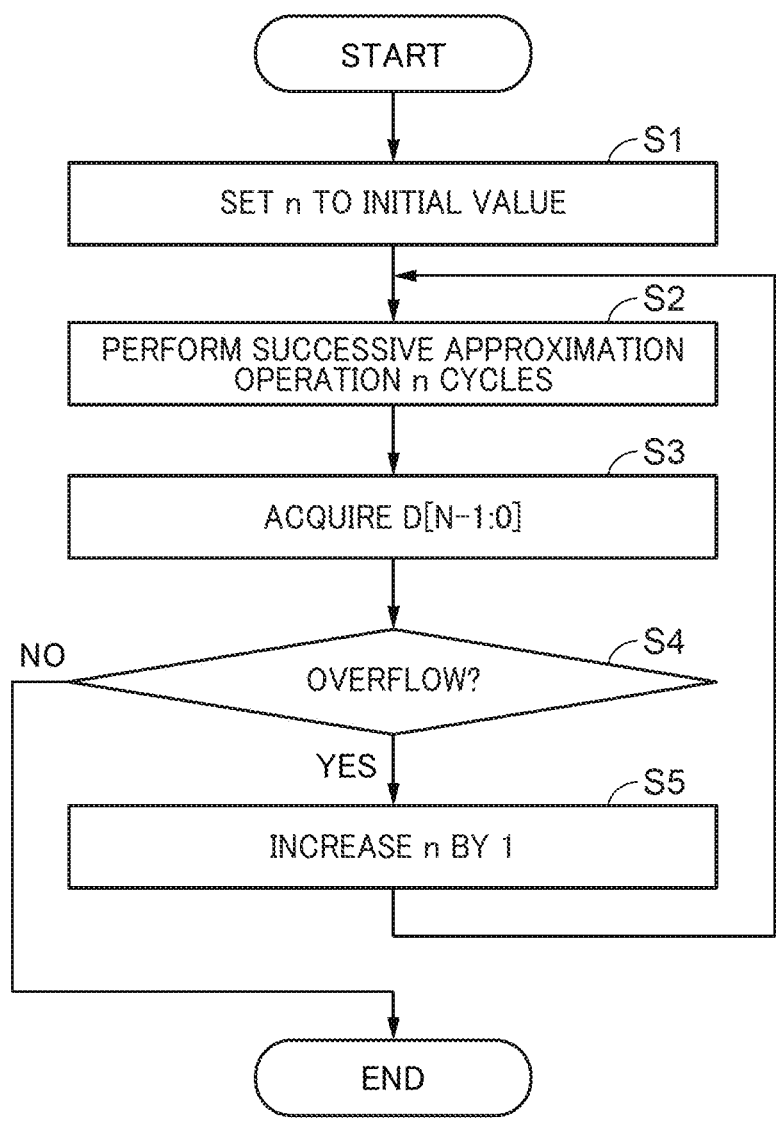
FIG. 11 is a flow chart showing an example of a calibration process performed by the control circuit.

FIG. 10 is a diagram showing an example of the amplifier circuit according to the present embodiment. As shown in FIG. 10, in the present embodiment, the control circuit 4 is inputted with the digital signal D[N−1:0] from the logic circuit 32. The other components are similar to those of the first embodiment.

Hereinafter, the process of searching the number of cycles n by the control circuit 4 is referred to as a calibration process. The control circuit 4 performs the calibration process before the start of the amplification process and at predetermined time intervals. FIG. 11 is a flow chart showing an example of the calibration process performed by the control circuit 4.

When the calibration process is started, the control circuit 4 sets the number of cycles n to an initial value first (Step S1). The initial value is 1 for example, but should not be limited thereto.

Next, the control circuit 4 amplifies the input signal $V_{IN}$ by the amplifier circuit. The amplifier circuit performs the sampling phase, first amplification phase, and second amplification phase. In the second amplification phase, the successive approximation circuit 3 performs the successive approximation operation n cycles (Step S2).

After that, the control circuit 4 acquires the digital signal D[N−1:0] outputted by the logic circuit 32 at the end of the second phase (Step S3).

Then, the control circuit 4 judges whether an overflow is occurring in the acquired digital signal D[N−1:0] (Step S4). The overflow means that every bit of the digital signal D[N−1:0] becomes 1 or 0. The overflow occurs when the amplification error included in the amplification signal outputted by the amplifier 2 at the end of the first amplification phase is larger than the voltage range $V_{RANGE}$.

When the overflow occurs (YES at Step S4), the control circuit 4 increases the number of cycles n by 1 (Step S5). After that, Steps S2 to S5 are repeated until the overflow does not occur in the digital signal D[N−1:0]. When no overflow is occurring at Step S4 (NO at Step S4), the control circuit 4 ends the calibration process. After that, the successive approximation circuit 3 performs the successive approximation operation n cycles set at the end of the calibration process.

The calibration process explained above makes it possible to set the number of cycles n to a minimum value satisfying that the voltage range $V_{RANGE}$ becomes larger than the amplification error. With this configuration, the amplification error included in the amplification signal $V_{OUT}$ at the end of the successive approximation operation can be made the LSB voltage $V_{LSB}$ or less. That is, the amplification accuracy of the amplifier circuit can be improved. Further, the number of cycles n can be restrained to increase the speed of the successive approximation operation.

Note that, in the present embodiment, it is also possible that the control circuit 4 sets the number of cycles n and repeatedly amplifies the input signal $V_{IN}$ n cycles to make a judgment on overflow based on a plurality of digital signals D[N−1:0] obtained through the amplification.

Further, in the above explanation, the control circuit 4 searches an optimum number of cycles n by gradually increasing the number of cycles n, but the control circuit 4 may search the optimum number of cycles n by gradually reducing the number of cycles n. In this case, the control circuit 4 should set the initial value of the number of cycles n to N and reduces the number of cycles n until an overflow occurs in the digital signal D[N−1:0] in order to set the number of cycles n to a value which is larger than n at the time of overflow by 1.

Fourth Embodiment

A pipeline ADC according to a fourth embodiment 100 will be explained referring to FIG. 12. A pipeline ADC 100 according to the present embodiment has the amplifier circuit according to any one of the first to third embodiments. The pipeline ADC 100 performs AD conversion on an analog signal $ADC_{IN}$ inputted thereto, and outputs a digital signal $ADC_{OUT}$ depending on the analog signal $ADC_{IN}$.

Figure 12:
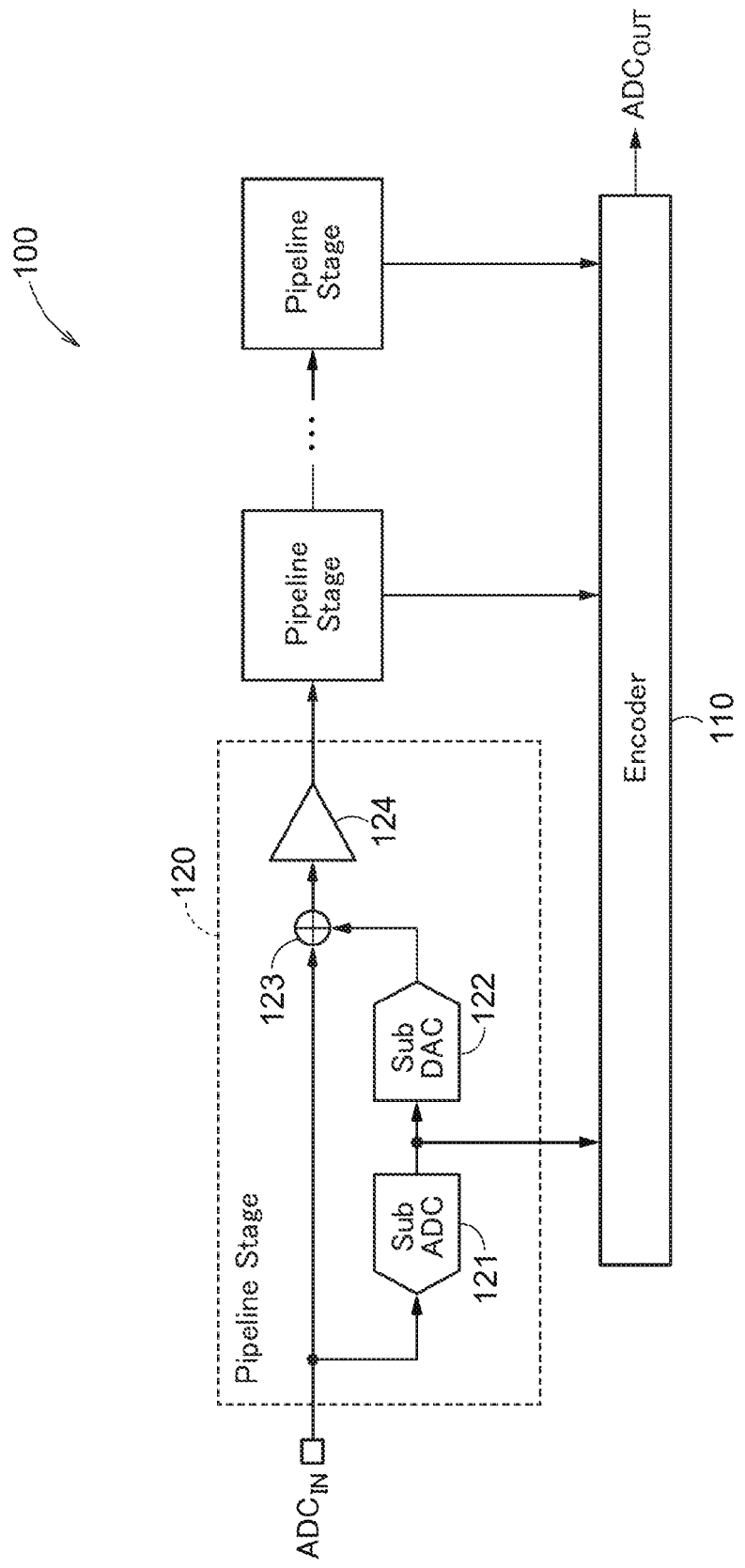
FIG. 12 is a diagram showing an example of a pipeline ADC according to a fourth embodiment.

FIG. 12 is a diagram showing an example of the pipeline ADC 100 according to the present embodiment. As shown in FIG. 12, the pipeline ADC 100 has an encoder 110 and a plurality of pipeline stages 120.

The encoder 110 encodes the digital signal $ADC_{OUT}$ based on the result of A/D conversion performed by each pipeline stages 120.

Each pipeline stage 120 has a sub-ADC 121, a sub-DAC 122, a residual calculation circuit 123, and an amplifier circuit 124.

The sub-ADC 121 is inputted with the analog signal $ADC_{IN}$ or the output signal of the pipeline stage 120 in the former stage, performs AD conversion on the inputted signal, and outputs a result of the A/D conversion. As the sub-ADC, an ADC such as a delta-sigma ADC, a flash ADC, and a successive approximation ADC can be arbitrarily used. The A/D conversion result outputted by the sub-ADC 121 is inputted into the sub-DAC 122 and encoder 110.

The sub-DAC 122 is inputted with the A/D conversion result from the sub-ADC 121, performs DA conversion on the inputted A/D conversion result, and outputs an analog signal. As the sub-DAC 122, a DAC such as a capacitive DAC and a resistive DAC can be arbitrarily used. The output signal of the sub-DAC 122 is inputted into the residual calculation circuit 123.

The residual calculation circuit 123 is inputted with the analog signal $ADC_{IN}$ or the output signal of the pipeline stage 120 in the former stage together with the output signal of the sub-DAC 122, and outputs a difference between these signals as a residual signal. As the residual calculation circuit 123, an analog adder, an analog subtractor, etc. can be used. The residual signal outputted by the residual calculation circuit 123 is inputted into the amplifier circuit 124.

The amplifier circuit 124 is the amplifier circuit according to any one of the first to third embodiments, which is inputted with the residual signal from the residual calculation circuit 123 and amplifies the residual signal inputted thereto. The residual signal corresponds to the input signal $V_{IN}$ mentioned above, and the output signal of the amplifier circuit 124 corresponds to the amplification signal $V_{OUT}$.

As explained above, the pipeline ADC 100 according to the present embodiment has the amplifier circuit according to any one of the first to third embodiments. Such a configuration makes it possible to improve the accuracy of AD conversion performed by the pipeline ADC 100 and to reduce power consumption.

Note that, in the present embodiment, the amplifier circuit according to any one of the first to third embodiments is applied to the pipeline ADC, but it can be applied to another kind of ADC such as a subrange ADC.

Fifth Embodiment

A wireless communication device 200 according to a fifth embodiment will be explained referring to FIG. 13. The wireless communication device 200 according to the present embodiment has the amplifier circuit according to any one of the first to third embodiments.

Figure 13:
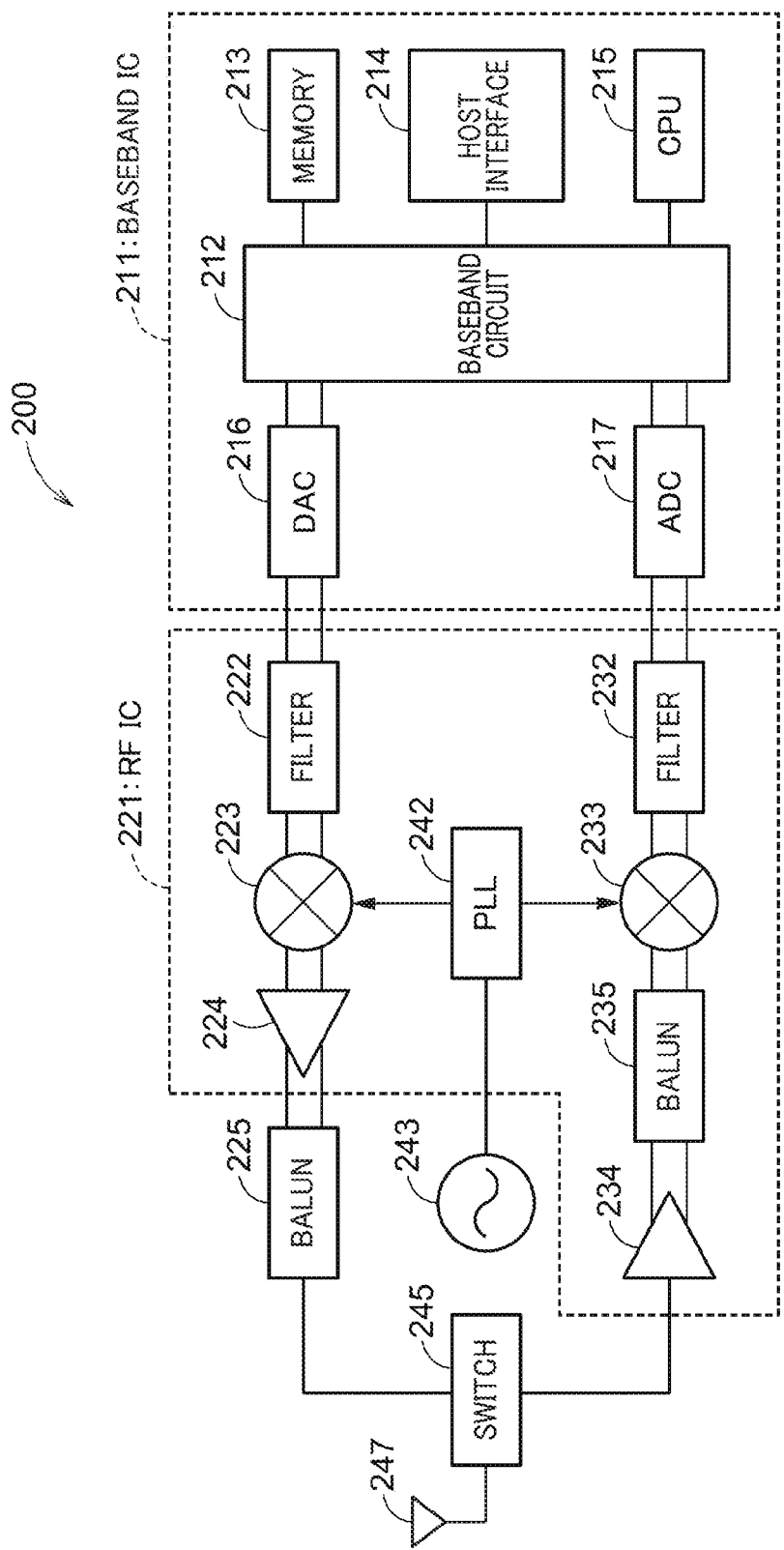
FIG. 13 is a diagram showing an example of a hardware configuration of a wireless communication device according to a fifth embodiment.

FIG. 13 is a diagram showing an example of a hardware configuration of the wireless communication device according to the present embodiment. This configuration can be applied both when a wireless terminal having the wireless communication device 200 serves as an access point and when it does not serve as an access point.

As shown in FIG. 13, this wireless communication device 200 has a baseband IC (Integrated Circuit) 211, an RF (Radio Frequency) IC 221, a balun 225, a crystal oscillator 243, a switch 245, and an antenna 247.

The baseband IC 211 has a baseband circuit 212, a memory 213, a host interface 214, a CPU (Central Processing Unit) 215, a DAC 216, and an ADC (Analog to Digital Converter) 217.

The memory 213 stores data exchanged between the wireless communication device 200 and a host system. The memory 213 further stores information notified to another wireless communication device and information notified by another wireless communication device, for example. Further, the memory 213 stores a program required to run the CPU 215, and is used as a work area for the CPU 215 to execute the program. The memory 213 may be a volatile memory such as an SRAM and a DRAM, or may be a nonvolatile memory such as a NAND and an MRAM.

The host interface 214 is an interface for connecting the wireless communication device 200 to the host system. The interface is, e.g., UART, SPI, SDIO, USB, or PCI Express, but should not be limited thereto.

The CPU 215 is a processor for controlling the baseband circuit 212 by executing a program. The baseband circuit 212 mainly performs a process in the MAC layer and a process in the physical layer. At least one of the baseband circuit 212 and CPU 215 functions as a communication control device for controlling communication.

Further, at least one of the baseband circuit 212 and CPU 215 may include a clock generator for generating a clock in order to manage the internal time of the communication device 200 by the clock generated by this clock generator.

As a process in the physical layer, the frame to be transmitted is added with a physical header, encoded, encrypted, and modulated (MIMO modulation may be used) by the baseband circuit 212 to generate e.g. two types of digital baseband signals (hereinafter referred to as a digital I signal and a digital Q signal). Here, the frame may include what is called a packet under the IEEE 802.11 standards or the standards based thereon, such as a Null Data Packet. Note that when transmitting a signal from a single system without performing orthogonal modulation, the baseband circuit 212 should generate one type of baseband signal.

The DAC 216 performs DA conversion on the signal inputted from the baseband circuit 212. More specifically, the DAC 216 converts the digital I signal into an analog I signal, and converts the digital Q signal into an analog Q signal. When the wireless communication device 200 has a plurality of antennas and transmits transmission signals from one or more systems allocating them to the antennas, the number of DACs 216 to be provided may depend on the number of antennas.

The ADC 217 of the baseband IC 211 will be mentioned later.

The RF IC 221 is at least one of an RF analog IC and a high frequency IC, for example. The RF IC 221 has a filter 222, a mixer 223, a preamplifier 224, a PLL 242, an LNA (Low Noise Amplifier) 234, a balun 235, a mixer 233, and a filter 232. Some of the above components of the RF IC 221 may be arranged on the baseband IC 211 or on another IC.

The filter 222 extracts a signal in a desired band from each of the analog I signal and analog Q signal inputted from the DAC 216. The filter 222 may be a band pass filter, or may be a low-pass filter.

The PLL 242 at least divides or multiplies the oscillation signal using the oscillation signal inputted from the crystal oscillator 243, to generate a constant frequency signal synchronizing with the phase of the input signal. The PLL 242 has a VCO (Voltage Controlled Oscillator) for example. The PLL 242 can generate the constant frequency signal by performing feedback control using the VCO based on the oscillation signal inputted from the crystal oscillator 243. The constant frequency signal thus generated is inputted into the mixers 223 and 233. The wireless communication device 200 may have another circuit capable of generating the constant frequency signal, instead of the PLL 242.

The mixer 223 up-converts the analog I signal and analog Q signal after passing through the filter 222 into radio frequencies by using the constant frequency signal supplied from the PLL 242.

The preamplifier 224 amplifies the analog I signal and analog Q signal at the radio frequencies generated by the mixer 223 to desired output power.

The balun 225 is a converter for converting balanced signals (differential signals) into an unbalanced signal (single-ended signal). The balanced signals used by the RF IC 221 should be handled as an unbalanced signal after those are outputted from the RF IC 221 and until those are transmitted to the antenna 247, and thus the balun 225 performs the above signal conversion.

In the case of transmission, the switch 245 is connected to the balun 225 on the transmitting side, and in the case of reception, the switch 245 is connected to the LNA 234 on the receiving side. The switch 245 may by controlled by the baseband IC 211, by the RF IC 221, or by another circuit provided to control the switch 245.

The analog I signal and analog Q signal at radio frequencies amplified by the preamplifier 224 undergo balance-unbalance conversion performed by the balun 225, to be emitted into the space from the antenna 247 as radio waves.

The antenna 247 may be a chip antenna, may be an antenna formed using wiring on a printed board, or may be an antenna formed using a linear conductive element.

The LNA 234 receives a signal from the antenna 247 through the switch 245, and amplifies the signal to a demodulable level while keeping noise low.

The balun 235 performs unbalance-balance conversion on the signal amplified by the LNA 234.

The mixer 233 down-converts the received signal converted into balanced signals by the balun 235 into baseband signals by using a constant frequency signal inputted from the PLL 242. More specifically, the mixer 233 generates carrier waves having phases shifted from each other by 90°, based on the constant frequency signal inputted from the PLL 242. Then, the mixer 233 performs orthogonal demodulation on the received signals converted by the balun 235 by using carrier waves having phases shifted from each other by 90°, to generate an I (In-phase) signal having the same phase as the received signal and a Q (Quad-phase) signal having a phase delayed from the I signal by 90°. Note that the mixer 233 may generate only a single system signal without performing the orthogonal demodulation.

The filter 232 extracts a signal in a desired band from each of the I signal and Q signal generated by the mixer 233. The filter 232 may be a band pass filter, or may be a low-pass filter.

The I signal and Q signal extracted by the filter 232 are subjected to gain adjustment and outputted from the RF IC 221.

The ADC 217 of the baseband IC 211 performs AD conversion on the signals inputted from the RF IC 221. More specifically, the ADC 217 converts the I signal into the digital I signal, and converts the Q signal into the digital Q signal.

In the present embodiment, as the ADC 217, an ADC having the amplifier circuit according to any one of the first to third embodiments is used. The ADC 217 may be the pipeline ADC according to the fourth embodiment, or may be another type of ADC having the abovementioned amplifier circuit. The digital I signal and digital Q signal outputted by the ADC 217 are inputted into the baseband circuit 212.

The baseband circuit 212 obtains a frame by performing a process in the physical layer such as demodulation (including MIMO demodulation), error correction code processing, and physical header processing, based on the digital I signal and digital Q signal inputted from the ADC 217. The baseband circuit 212 performs a process in the MAC layer on the frame. When the baseband circuit 212 supports TCP/IP, it may perform a TCP/IP process.

Note that, in the example of FIG. 13, the wireless communication device 200 has one antenna 247, but it may have a plurality of antennas. In this case, the wireless communication device 200 may have a set consisting of the transmission system (216 and 222 to 225), reception system (232 to 235), PLL 242, crystal oscillator 243, and switch 245 with respect to each antenna 247. Each set may be connected to the baseband circuit 212.

Further, the baseband IC 211 and RF IC 221 may be formed on the same substrate. Furthermore, the baseband IC 211 and RF IC 221 may be formed in one chip. Both or any one of the DAC 216 and ADC 217 may be arranged in the RF IC 221, or may be arranged in another IC. Further, both or any one of the memory 213 and CPU 215 may be arranged in an IC separated from the baseband IC.

As explained above, the wireless communication device 200 according to the present embodiment has the ADC 217 having the amplifier circuit according to any one of the first to third embodiments. Such a configuration makes it possible to improve communication accuracy of the wireless communication device 200 and to reduce power consumption.

Sixth Embodiment

A wireless terminal according to a sixth embodiment will be explained referring to FIGS. 14 to 16. The wireless terminal according to the present embodiment has the wireless communication device according to the fifth embodiment. Each of FIGS. 14 and 15 is a perspective diagram showing an example of the wireless terminal according to the present embodiment.

Figure 14:
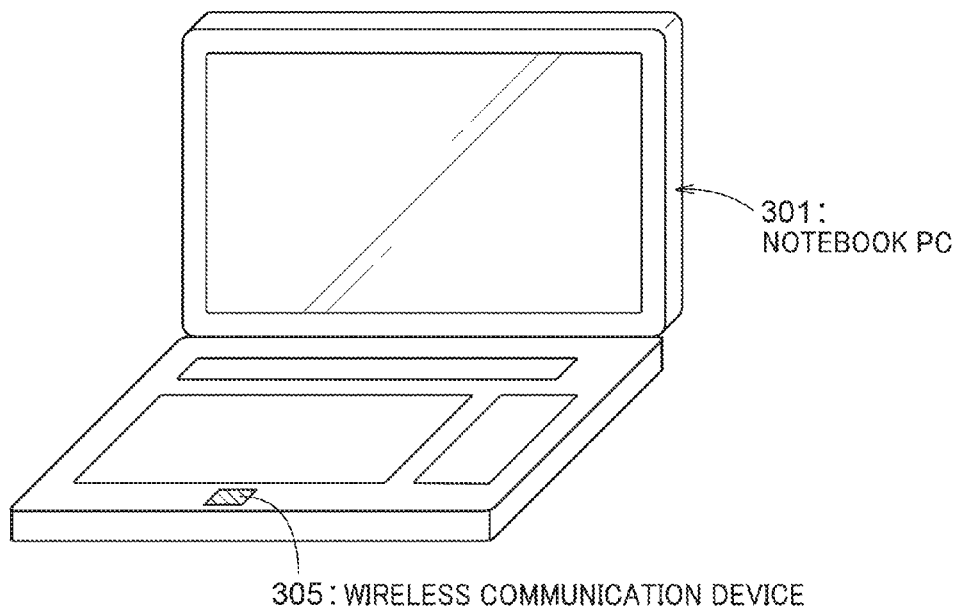
FIG. 14 is a perspective diagram showing an example of a wireless terminal according to a sixth embodiment.
Figure 15:
FIG. 15 is a perspective diagram showing an example of a wireless terminal according to the sixth embodiment.
Figure 16:
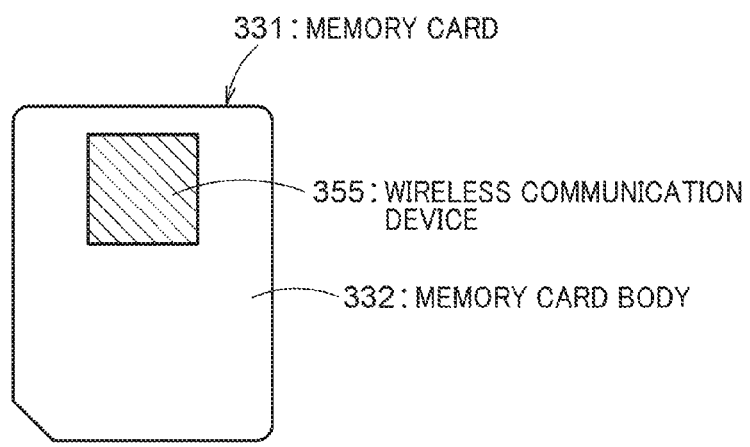
FIG. 16 is a diagram showing an example of a memory card having the wireless communication device according to the fifth embodiment.

The wireless terminal of FIG. 14 is a notebook PC 301, and the wireless terminal of FIG. 15 is a mobile wireless terminal 321. The notebook PC 301 and mobile wireless terminal 321 have wireless communication devices 305 and 315 respectively. Each of the wireless communication devices 305 and 315 is the wireless communication device according to the fifth embodiment.

Note that the radio communication terminal having the wireless communication device should not be limited to the notebook PC and mobile wireless terminal. The wireless communication device may be mounted on, e.g., TV, digital camera, wearable device, tablet, smartphone, game device, network storage device, monitor, digital audio player, Web camera, video camera, project, navigation system, external adapter, internal adapter, set-top box, gateway, printer server, mobile access point, router, enterprise/service provider access point, portable device, handheld device, etc.

Further, the wireless communication device according to the fifth embodiment can be mounted on a memory card. FIG. 16 is a diagram showing an example of the memory card. A memory card 331 of FIG. 16 includes a wireless communication device 355 according to the fifth embodiment and a memory card body 332. The memory card 331 uses the wireless communication device 335 to wirelessly communicate with an external device (another wireless terminal, access point, etc.) Note that the other elements (such as a memory) in the memory card 331 are omitted from FIG. 16.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An amplifier circuit comprising:
   a sample-and-hold circuit to sample and hold an input signal;
   an amplifier which comprises an input terminal inputted with the input signal held by the sample-and-hold circuit and an output terminal outputting an amplification signal obtained by amplifying the input signal inputted;
   a feedback capacitor to be connected between the input terminal and output terminal of the amplifier;
   a successive approximation circuit to perform successive approximation operation to correct the amplification signal based on a voltage of the input terminal of the amplifier, the successive approximation operation being performed a predetermined number of cycles; and
   a control circuit to control the successive approximation circuit based on an amplification error included in the amplification signal.

2. The amplifier circuit of claim 1, wherein the control circuit controls the number of cycles of the successive approximation operation performed by the successive approximation circuit.

3. The amplifier circuit of claim 1, wherein the control circuit increases the number of cycles as the amplification error becomes larger.

4. The amplifier circuit of claim 1, wherein the control circuit detects an environmental condition on which the amplification error depends, and controls the number of cycles based on a detection result.

5. The amplifier circuit of claim 4, wherein the environmental condition includes at least one of threshold voltage of a transistor of the amplifier, power-supply voltage, and temperature.

6. The amplifier circuit of claim 1,
   wherein the control circuit comprises:
   a ring oscillator; and
   a counter to count the number of oscillations of the ring oscillator to output a count value.

7. The amplifier circuit of claim 1, wherein the control circuit comprises a temperature sensor.

8. The amplifier circuit of claim 1, wherein the successive approximation circuit changes the amplification signal so that the voltage of the input terminal of the amplifier approaches a reference voltage.

9. The amplifier circuit of claim 1,
   wherein the successive approximation circuit comprises:
   a comparator to compare the voltage of the input terminal of the amplifier with a reference voltage to output a comparison result;
   a DAC to change the amplification signal; and
   a logic circuit to control the DAC based on the comparison result.

10. The amplifier circuit of claim 1, wherein the control circuit controls a reference voltage of a DAC included in the successive approximation circuit.

11. The amplifier circuit of claim 10, wherein the control circuit increases the reference voltage as the amplification error becomes larger.

12. The amplifier circuit of claim 1, wherein the control circuit searches the number of cycles which makes it possible that a voltage range in which the amplification signal can be corrected by the successive approximation circuit becomes larger than the amplification error.

13. The amplifier circuit of claim 12, wherein the control circuit increases the number of cycles until an output signal of a logic circuit included in the successive approximation circuit does not overflow.

14. A pipeline ADC having an amplifier circuit,
   the amplifier circuit comprising:
   a sample-and-hold circuit to sample and hold an input signal;
   an amplifier which comprises an input terminal inputted with the input signal held by the sample-and-hold circuit and an output terminal outputting an amplification signal obtained by amplifying the input signal inputted;
   a feedback capacitor to be connected between the input terminal and output terminal of the amplifier;
   a successive approximation circuit to perform successive approximation operation to correct the amplification signal based on a voltage of the input terminal of the amplifier, the successive approximation operation being performed a predetermined number of cycles; and
   a control circuit to control the successive approximation circuit based on an amplification error included in the amplification signal.

15. A wireless communication device having an amplifier circuit,
   the amplifier circuit comprising:
   a sample-and-hold circuit to sample and hold an input signal;
   an amplifier which comprises an input terminal inputted with the input signal held by the sample-and-hold circuit and an output terminal outputting an amplification signal obtained by amplifying the input signal inputted;

a feedback capacitor to be connected between the input terminal and output terminal of the amplifier;

a successive approximation circuit to perform successive approximation operation to correct the amplification signal based on a voltage of the input terminal of the amplifier, the successive approximation operation being performed a predetermined number of cycles; and a control circuit to control the successive approximation circuit based on an amplification error included in the amplification signal.

* * * * *